United States Patent [19]

Bhatt et al.

[11] Patent Number: 5,310,428

[45] Date of Patent: May 10, 1994

[54] SOLVENT STABILIZATION PROCESS AND METHOD OF RECOVERING SOLVENT

[75] Inventors: Anilkumar C. Bhatt, Johnson City; Kostas I. Papathomas, Endicott; Terry D. Sinclair, Endicott; Jerome J. Wagner, Endicott, all of N.Y.

[73] Assignee: Inernational Business Machines Corporation, Armonk, N.Y.

[21] Appl. No.: 994,868

[22] Filed: Dec. 22, 1992

[51] Int. Cl.$^5$ ............................................. B08B 3/08
[52] U.S. Cl. ............................................. 134/2; 134/10; 134/12; 252/79.4
[58] Field of Search ................................. 134/10, 12, 2; 252/79.4

[56] References Cited

U.S. PATENT DOCUMENTS

| | | |
|---|---|---|
| 3,764,384 | 10/1973 | Berni ........................ 134/10 |
| 4,590,301 | 5/1986 | Lim et al. .................. 568/633 |
| 4,748,218 | 5/1988 | Sharaby ...................... 526/84 |
| 5,064,557 | 11/1991 | Fusiak ........................ 252/162 |

Primary Examiner—R. Bruce Breneman
Assistant Examiner—Thomas G. Dunn, Jr.
Attorney, Agent, or Firm—Richard M. Goldman

[57] ABSTRACT

Disclosed is a method of thermally stabilizing an effluent stream from an industrial process, such as a photolithographic process, to allow thermally manageable recovery of the solvent. In the separation and recovery process the solvent is exposed to temperatures that can cause polymerization of the relatively small amounts of monomer still contained therein. This polymerization is an exothermic polymerization, which can accelerate the polymerization of the remaining monomer, potentially causing a thermally initiated, exothermic, run away polymerization. Run away, thermally initiated, exothermic polymerization can materially degrade the solvent. The thermally initiated, run away exothermic reaction is inhibited by the inclusion of a thermal stabilizer or polymerization inhibitor.

5 Claims, 2 Drawing Sheets

SOLVENT STABILIZATION PROCESS AND METHOD OF RECOVERING SOLVENT

CROSS REFERENCE TO RELATED APPLICATIONS

This application is related to the following commonly assigned, copending U.S. Patent Applications:
1. U.S. application Ser. No. 07/781,541, filed Oct. 22, 1991, of N. R. Bantu, Anilkumar Bhatt, Ashwinkumar Bhatt, G. W. Jones, J. A. Kotylo, R. J. Owen, K. I. Papathomas, and A. K. Vardya for Photoresist Develop And Strip Solvents and Methods for their Use, now U.S. Pat. No. 5,268,260.
2. U.S. Application of Gary S. Ksenak for Organic Emission Scrubbing Abatement for Propylene Carbonate, Ser. No. 07/924,769, now abandoned.
3. U.S. Application of Kevin P. Unger and James A. Shurtleff for Chemical Pre-Treatment and Biological Destruction of Propylene Carbonate Effluent Streams, now U.S. Pat. No. 5,275,734.
4. U.S. Application of J. J. Wagner, A. C. Bhatt, R. N. Bantu, R. W. Keesler, T. D. Sinclair, and K. I. Papathomas for Propylene Carbonate Recovery Process, now U.S. Pat. No. 5,281,723.

FIELD OF THE INVENTION

The invention described herein relates to environmentally compatible developers and stripping solvents for photoresist materials. Specifically, the invention relates to stabilizing developers and stripping solvents in order to avoid exothermic reactions during recovery of the solvents.

Exemplary developers and stripping solvents include cyclic alkylene carbonate solvents, i.e. propylene carbonate, and other solvents, such as benzyl alcohol, gamma-butyrolactone, n-methyl pyrrolidone and dimethyl sulfoxide as substitutes for such chlorinated solvents as Methyl Chloroform (MCF; 1,1,1-Trichloroethane) and Methylene Chloride (MC; Dichloromethane). Impure liquid compositions of the solvent and photoresist and/or solder mask material are recovered from circuit panel manufacturing processes.

In the invention described herein the impure liquid product of the manufacturing process is treated to recover the solvent. The recovery process includes separations based on heating the stream under conditions where monomeric material in the stream could exothermically polymerize.

According to the method of the invention the developer/stripping solvent is stabilized to prevent these exotherms. Exemplary stabilizers are quinone type stabilizers, including hydroquinone, p-methoxy phenol, alkyl substituted hydroquinones, aryl substituted quinones, tert-butyl catechol, pyrogallol, naphthylamines, beta-napthol, 2,6-di-tert-butyl-p-cresol, phenothiazine, pyridine, nitrobenzene, dinitrobenzene, p-toluequinone, and chloranil, as well as copper organo-metallics.

BACKGROUND OF THE INVENTION

Photolithographic processes in packaging are described in *Microelectronics Packaging Handbook*, Van Nostrand Reinhold, New York, 1989, Tummala et al, eds. on pages 898–903, in *Principles of Electronic Packaging*, McGraw-Hill Book Company, New York, 1989, Seraphim et al, eds. in Chapter 12, pages 372–393 and in *Scientific Encyclopedia*, 6th Ed., Vol. II, Pub. Van Nostrand Reinhold Company, New York, 1983, Considine et al, eds., pages 1877–1881, all of which are incorporated herein by reference for use as background.

Photolithography plays a critical role in the art of printed circuit packaging. Photolithography is used to define in a thin film of photoresist those regions either from which copper is to be selectively etched to subtractively form circuitization, or selectively plated to additively form circuitization.

There are two types of photoresist: negative and positive. A negative photoresist is polymerized by exposure, e.g., selective exposure to the particular actinic radiation to which it is sensitive for an adequate period of time. It is then subjected to its developer. The developer solubilizes the areas of the resist which have not been exposed to actinic radiation. The areas of negative photoresist which have been exposed to actinic radiation are hardened by cross-linking and made more resistant to developer, relative to the unexposed regions.

Positive acting resists behave oppositely. Actinic radiation renders the positive acting photoresist more soluble in the developer, and the exposed regions are removed preferentially by a dilute alkaline developer.

Positive acting photoresists are used extensively to fabricate silicon devices, and for subtractive circuitization of printed circuit boards. However, positive photoresists, which are readily developed by dilute aqueous alkaline solutions and stripped by more concentrated aqueous alkaline solutions, perform poorly in high caustic environments and high temperatures.

The negative resists, on the other hand, are used when the circuit lines are provided by additive plating of copper, in areas where copper is desired, i.e., electroless or electroless plus electroplating, rather than by etching of copper away from where it is not desired.

Negative acting photoresists are cross-linked by the action of actinic energy on photoactive agents that form the free radicals or ionic groups necessary to initiate and/or support polymerization. Depending on their composition, commercially available photoresists are sensitive to UV radiation, X-rays, E-beams and so forth. The radiation may be furnished to the resist through a pattern in a mask, such as an emulsion mask or chrome mask, by contact or projection, or a beam of radiation may be rastered.

Negative acting photoresists include an organic resin binder, a photoinitiator/photosensitizer and a reactive monomer. Optionally, negative acting photo-resists also include fillers, for example, organic or inorganic fillers, fire retardants, plasticizers, dyes, flexibilizers, thermal stabilizers and other additives to improve the processing characteristics of the package.

Typical negative photoresist compositions include from 40 to 70% by weight of binder, 10 to 40% by weight of monomer, and 0.5 to 15% by weight of photoinitiator, to total 100% based on the weight of all these components.

In general, negative-working resists are photopolymerizable materials. Monomers which can be used either alone or in combination with others to for negative acting photoresists include: t-butyl acrylate, 1,5 pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as 2,2-di-(p-hydroxyphenyl)-propane diacrylate, pentaerythritol tetraacrylate, 2,2-di(p-hydrohyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the monomers mentioned above, the photoresist material can also contain one or more free radical-initiated and polymerizable species with molecular weight of at least about 300. Monomers of this type are an alkylene or a polyalkylene glycol diacrylate.

Free radical initiators incorporated in the photoresist which can be activated by actinic radiation which are thermally inactive at and below 185 degrees C. include the substituted or unsubstituted polynuclear quinones, such as 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrequinone, 1,2-benzanthraquinone, 2,3-benzanthraquinone, 2-methyl-1,4-naphthone, 2,3-dichloronaphthoquinone, 1,4-dimethylanthraquinone, 2,3-dimethylanthraquinone, 2-phenylanthraquinone, 2,3-diphenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione.

Other suitable photoinitiators are known to the expert and can be seen from the following publications; J. Kosar, "Light-Sensitive Systems," John Wiley & Sons, New York, 1965, Chapters 4 ("Unsaturated Compounds"), 5 ("Photopolymerization Processes") and 8 (Photopolymerization of Vinyl Monomers), "Chem. Revs." 68, 125–151 (1968); J. F. Rabek "Photosensitized Processes in Polymer Chemistry: A Review," Photochem. Photobiol. 7, 5–57 (1968); G. Delzenne, "Sensitizers of Photopolymerization," Ind. Chim. Belge 24, 739–764 (1959); and C. M. McCloskey and J. Bond, "Photosensitizers for Polyestervinyl Polymerization," Ind. Eng. Chem. 47, 2,125–2,129 (1955).

Dyes incorporated in the photoresist which are of a photoreducible nature include dyes of the phenazine, oxazine and quinone classes; micheler's ketone, benzophenone, 2,4,5-triphenylimidazolyl dimers with hydrogen donors, and mixtures thereof.

Polymeric binders which can be used alone, or in combination with polymerizable monomers include the following: polyacrylate and alpha-alkyl polyacrylate esters, i.e. polymethyl methacrylate and polyethyl methacrylate; polyvinyl esters: i.e. polyvinyl acetate, polyvinyl acetate/acrylate, polyvinyl acetate/methacrylate and hydrolyzed polyvinyl acetate; ethylene/vinyl acetate copolymers; polystyrene polymers and copolymers, i.e. with maleic anhydride and esters; vinylidene chloride copolymers, i.e. vinylidene chloride/acrylonitrile; vinylidene chloride/methacrylate and vinylidene chloride/vinyl acetate copolymers; polyvinyl chloride and copolymers, i.e. polyvinyl chloride/acetate; saturated and unsaturated polyurethanes; synthetic rubbers, i.e. butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weight from about 4,000 to 1,000,000; epoxides, i.e. containing acrylate or methacrylate groups; copolyesters; nylons or polyamides, i.e. N-methoxymethyl, polyhexamethylene adipamide; cellulose esters, i.e. cellulose acetate succinate and cellulose acetate butyrate; cellulose ethers, i.e. methyl cellulose, ethyl cellulose and benzyl cellulose; polycarbonates; polyvinyl acetal, i.e. polyvinyl butyral, polyvinyl formal; polyformaldehydes.

In addition to the polymeric binders listed above, particulate thickeners, i.e. silicas, clays, alumina, bentonites, kaolnites, and the like can be used.

Where aqueous developing of the photoresist is desirable the binder should contain sufficient acidic or other functionalities to render the composition processable in the aqueous developer. Polymers derived from an aminoalkyl acrylate or methacrylate, acidic film-forming comonomer and an alkyl or hydroxyalkyl acrylate can be included.

Dyes and pigments may also be added to increase the visibility of the resist image. Any colorant used however, should be transparent to the actinic radiation used.

In the preparation of these formulations generally inert solvents are employed which are volatile at ordinary pressures. Examples include alcohols and ether alcohols, esters, aromatics, ketones, chlorinated hydrocarbons, aliphatic hydrocarbons, miscellaneous solvents such as dimethylsulfoxide, pyridine, tetrahydrofuran, dioxane, dicyanocyclobutane and 1-methyl-2-oxo-hexamethyleneimine, and mixtures of these solvents in various proportions as may be required to attain solutions. Antiblocking agents to prevent the coatings from adhering to the supporting films can also be included.

With some polymers, it is desirable to add a plasticizer, either solid or liquid, to give flexibility to the film or coating. A preferred liquid plasticizer is nolylphenoxypoly(ethyleneoxy)-ethanol. A preferred solid plasticizer is N-ethyl-p-toluenesulfonamide.

Photoimageable compositions are also utilized as solder masks. In such application a photoimageable composition is used by applying the composition to printed circuit board and followed by photolithographic techniques to expose various underlying features on the board while masking others. During the soldering process the solder will deposit onto the exposed underlying components. It is necessary that the solder mask material be formulated such that it can be applied by the appropriate methods, for example curtain coating.

In processing negative working resists, unexposed areas of the imaged film are typically removed from the surface of a printed circuit board or substrate by action of a liquid developer in a spray form for a duration of several minutes or less. Depending on the particular type of photoresist composition the liquid developer may be a simple organic solvent, an aqueous solution of an inorganic base, or a combination of organic solvent and aqueous base to form a semi-aqueous developer.

Methyl chloroform (MCF, 1,1,1-trichloroethane), and methylene chloride (MC, dichloromethane) are solvents which are widely used in the electronic packaging art and in other arts for developing and removing a number of photoresists which are otherwise resistant to chemical attack.

The highly alkaline electroless copper plating baths used in additive processes provide a harsh environment for photoresist. In general, the more chemically impervious resists are removable in an organic solvent such as methylene chloride. For less demanding chemical environments, aqueous developable photoresists may be adequate. The organically developable resists, however, continue to be used in an electroless copper environment and in the print band and thin film technologies in conjunction with acrylate-based resist such as Du-Pont's Riston T-168 and solvent processed solder masks such as the DuPont Vacrel 700 and 900 series, environments in which the aqueous resists are vulnerable.

The use of 1,1,1-trichloroethane and methylene chloride is disfavored because of growing environmental concerns over the effect of gaseous halogenated hydrocarbons on the depletion of earth's ozone layer and concerns over introducing suspected carcinogens to the atmosphere. Several countries have set goals for their total elimination. However, there continue to be many manufacturing processes in which use of resists which are aqueously developable simply is not feasible.

The industry therefore continues the search for organic solvents as alternates to 1,1,1-trichloroethane and methylene chloride. The new solvents must meet specific manufacturing and environmental requirements with respect to flammability, toxicity, ability to effect dissolution, shelf-life, waste disposal, ability to recycle, simplicity of composition, and compatibility with a spectrum of resists.

Alternative solvents for stripping solvent based Riston photoresists are also described in Research Disclosures, June 1989 p.302, published anonymously.

There have been previous attempts reported in the art to provide environmentally friendly alternatives to 1,1,1-trichloroethane and methylene chloride. However, none of the references describe the simple, environmentally acceptable, room temperature developers and strippers described by the commonly assigned, copending U.S. application Ser. No. 07/781,541, filed Oct. 22, 1991, of N. R. Bantu, Anilkumar Bhatt, Ashwinkumar Bhatt, G. W. Jones, J. A. Kotylo, R. J. Owen, K. I. Papathomas, and A. K. Vardya for Photoresist Develop and Strip Solvents and Methods for their Use (now abandoned). This application describes the use of 4-methyl-1,2-dioxolan-2-one (propylene carbonate, methyl ethylene carbonate, 1,2-propylene carbonate) as a developer and as a stripping agent.

Ser. No. 07/781,541 describes the use of propylene carbonate as an alternative to halogenated hydrocarbon developers and strippers for use in developing and stripping acrylate based photoresist such as Riston T-168 and polymethyl methacrylate, and solvent processed solder masks such as the Vacrel 700 and 900 series.

As described therein the radiation-exposed resists are developed in a low vapor pressure, high boiling temperature solvent selected from the group consisting of propylene carbonate (PC), gamma-butyrolactone (BLO) and benzyl alcohol (BA). The process occurs at about 24 to 45 degrees C., for about 0.5-12 minutes and is normally followed by a warm water or alternate low boiling solvents rinse to remove excess developer. These solvents are high boiling temperature, low vapor pressure, solvents. By way of contrast, the common developers of the prior art for developing Riston type photoresists are low boiling solvents. The use of low boiling solvents such as methyl chloroform (MCF), methyl ethyl ketone (MEK), xylenes or mixtures thereof are similar to the methylene chloride stripping process for purposes of thermal management.

By way of contrast low vapor pressure, high boiling temperature solvents, i.e. n-methyl pyrrolidone (NMP), gamma-butyrolactone (BLO), dimethyl sulfoxide (DMSO) and propylene carbonate (PC) must be followed by a rinsing step with a compatible solvent or water. Furthermore, in order to obtain dissolution times comparable to those of MC, it is necessary that temperature during stripping be maintained at above about 50 degrees C. It has been found that improved dissolution times can be achieved with stripping temperatures between 50 degrees C. and 100 degrees C. However, these requirements add to the expense and difficulty of recovering the high boiling temperature, low vapor pressure solvents, such as propylene carbonate, which are expensive, for reuse. Moreover, the recovery process for these high boiling temperature, low vapor pressure solvents, such as propylene carbonate and similar solvents, exposes the waste stream, which also contains photoresist materials, to uncontrollable exothermic reactions.

Thus, there is a clear need for a low cost, safe, thermally manageable process for the recovery of high boiling solvents, such as propylene carbonate. The process must allow recycle and reuse of these relatively high cost, high boiling temperature, low vapor pressure solvents. Specifically, the process must avoid uncontrollable exothermic reactions in the effluent stream.

OBJECTS OF THE INVENTION

It is a primary object of the invention to provide a safe, manageable, simple, low cost process to recycle and reuse high boiling temperature (measured at 1 atmosphere absolute), low vapor pressure (measured at room temperature) solvents, including photolithographic developing agents and photolithographic stripping agents, such as cyclic alkylene carbonates i.e. propylene carbonate, gamma-butyrolactone and benzyl alcohol.

It is another object of the invention to expedite the recycle and reuse of these solvents, developers, and stripping solvents with minimal exothermic side reactions.

It is a further object of the invention to expedite the recycle and reuse of these solvents, developers, and stripping solvents with minimal thermal degradation thereof.

It is a still further object of the invention to recover the solvents at conditions of process controllability, temperature and pressure which minimize the hazards of combustion and explosion, averting the need for special construction.

SUMMARY OF THE INVENTION

The present invention describes the recovery of non-toxic, high boiling solvents proposed as safe alternatives to halogenated low boiling solvents currently used, for example, as common developers and stripping solvents for Riston type photoresists.

Developing and stripping of organic polymeric films with the high boiling solvents, i.e. n-methyl pyrrolidone (NMP), gamma-butyrolactone (BLO), dimethyl sulfoxide (DMSO), benzyl alcohol (BA) and propylene carbonate (PC), requires a subsequent rinsing step with a compatible solvent or water. This rinsing step introduces a complication into the recovery of the cyclic alkylene carbonate solvent, the contamination thereof by the solvent or water introduced during the rinsing step. This is addressed in the commonly assigned, co-pending U.S. Application of J. J. Wagner, A. C. Bhatt, R. N. Bantu, R. W. Keesler, T. D. Sinclair, and K. I. Papathomas for Propylene Carbonate Recovery Process, now U.S. Pat. No. 5,281,723.

Furthermore, in order to obtain polymer dissolution times comparable to those of halogenated solvents, it is necessary that temperature during, for example, stripping of photolithographic mask materials, be maintained at above about 50 degrees C. These temperatures, as well as temperatures encountered during separation process incident to solvent separation and recovery, introduce still further complications into the recovery of the solvent. One such difficulty is the thermally initiated degradation or decomposition thereof, initiated by the thermally initiated exothermic polymerization of monomeric constituents of the polymer, such as the thermally polymerizable monomers, exemplified by trimethylol-propane triacrylate (TMPTA), present in, for example, acrylic acid-acrylate ester type photoresists.

These problems are solved by the process described herein. According to the process described herein, the solvent carries its own thermal polymerization inhibitor. This initiator is in addition to the thermal polymerization inhibitor normally present in the polymer. Thus, entrained and/or solubilized photoresist is inhibited from exothermic polymerization while the solvent is recovered from the effluent stream of a photolithographic process.

The effluent, e.g., the photolithographic effluent, contains the solvent, water, and polymeric solids, including small amounts of monomer. In the recovery process the photolithographic effluent is first enriched with a certain amount of thermal polymerization inhibitor and then fed to a first separation stage, such as a vertical tube heat exchanger type evaporator, and separated into (i) water and volatiles, and (ii) solvent (including entrained and/or solubilized photoresist materials). This lowers the concentration of water in the solvent stream to a level that is low enough to substantially avoid hydrolysis of the solvent.

The dewatered solvent is then separated, for example in a wiped film type evaporator, to separate the solvent from higher boiling materials and polymeric solids. In this stage the dewatered solvent stream is separated into (i) a solvent fraction, and (ii) a polymeric solids fraction. The polymeric solids fraction contains polymeric material in liquid solvent.

The solvent fraction is further separated in a fractionation means into a higher vapor pressure fraction, and a lower vapor pressure fraction.

BRIEF DESCRIPTION OF THE FIGURES

The invention may be understood by reference to the FIGURES appended hereto.

DETAILED DESCRIPTION OF THE INVENTION

Figure 1A:
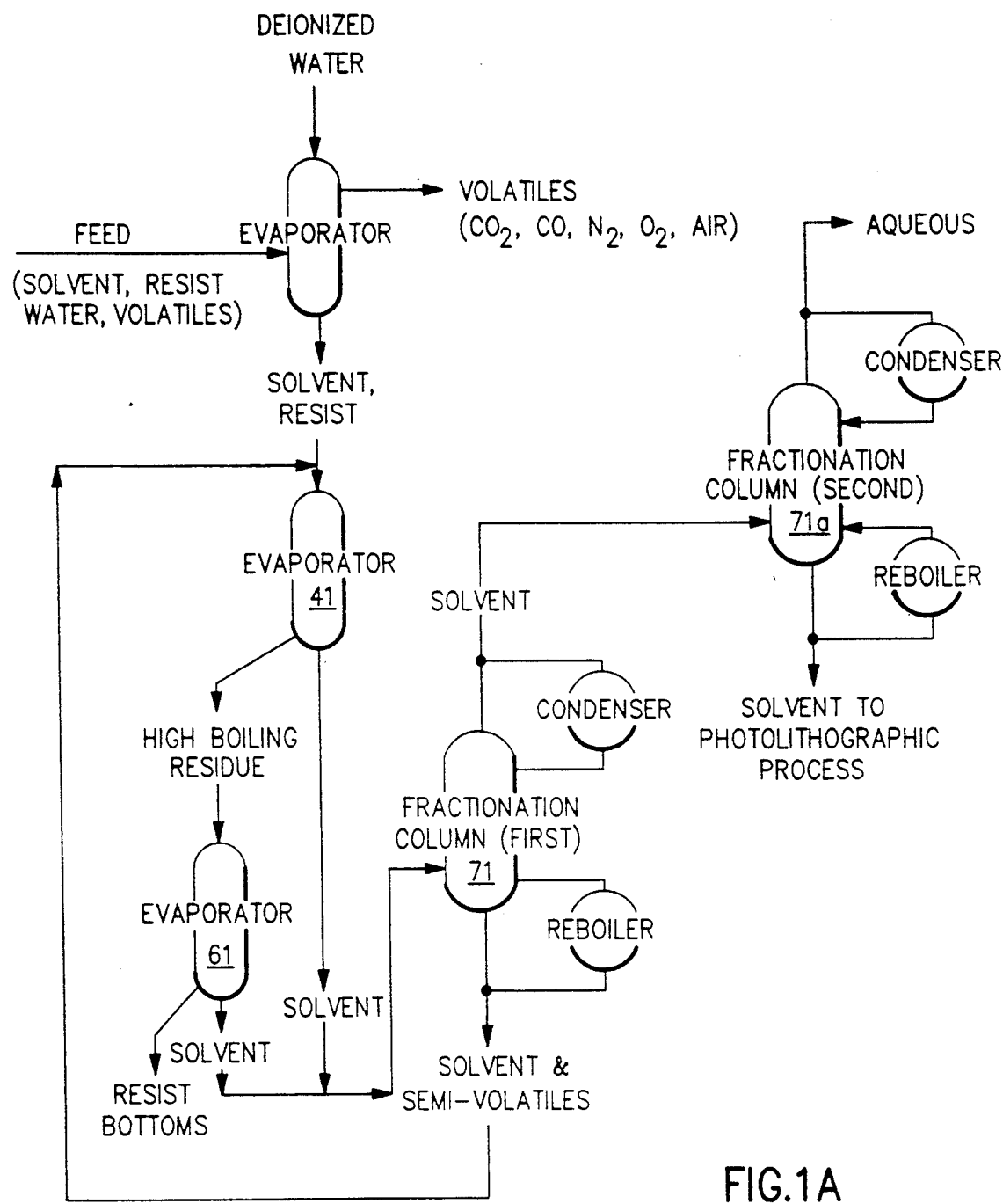
FIGS. 1A and 1B are flow charts of alternative exemplifications of the alkylene carbonate recovery process of the invention.

Impure solvent, such as propylene carbonate, gamma-butyrolactone or benzyl alcohol is an effluent from an upstream industrial process in which relatively pure solvent has been used as a degreasing solvent, a cleaning agent, a photolithographic developing agent, a photolithographic stripping agent, or the like, in the removal of a thin film, layer, or coating of a polymeric material. The impure solvent contains both solubilized polymer and dispersed solid polymer. The polymer, whether solubilized or dispersed, and including a small amount of monomer, is referred to herein as "solids."

In one embodiment of the invention the polymer is a photoresist, for example, a negative photoresist formed of acrylic acid and acrylate ester moieties, such as DuPont Riston, and the effluent is the effluent of either or both of the developing and stripping steps. In an alternative embodiment the polymer may be an acrylic or vinylic polymer residue of a fabricating, machining, molding, or coating process, containing small amounts of monomeric material, e.g., unreacted monomeric material, or cross linking agent.

While the invention is described and illustrated with respect to propylene carbonate,

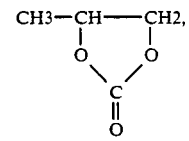

it is, of course, to be understood, that higher cyclic alkylene carbonate homologs of propylene carbonate, such as

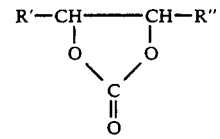

where R' and R" are short chain alkyl groups, a $C_1$-$C_{10}$ alkyl, aryl or aralkyl group may be used. Exemplary short chain alkyl groups are $CH_3$—$(CH_2)_n$—, where n in R' and R" are independent integers from 0 to 3. It is, of course, further to be understood, that the vapor pressure of the cyclic alkylene carbonate must be high enough to allow fractionation or separation. Most preferably, the cyclic alkylene carbonate is propylene carbonate, ethylene carbonate, such as butylene carbonate, octylene carbonate, or styrene carbonate may also be used, however.

It is also to be understood that the method of this invention is directly applicable to other high atmospheric boiling temperature, low room temperature vapor pressure solvents, such as gamma-butyrolactone, benzyl alcohol, N-methyl pyrrolidone and dimethyl sulfoxide.

In the embodiment of the invention where the polymer is an acrylic-acrylate type photoresist containing low levels of monomers, such as trimethylol-propane triacrylate (TMPTA), the effluent of the photolithographic process contains (i) from about 7-weight percent to about 99 weight percent of propylene carbonate, (ii) from about 0.2 weight percent to about 30 weight percent of "solids," that is, dispersed solid polymer, dissolved, solubilized polymer, and monomeric materials, as TMPTA, (iii) from about 0.01 weight percent to about 12 weight percent of propylene glycol, a hydrolysis decomposition product of propylene carbonate, and (iv) from about 0.01 weight percent to about 7.0 weight percent of water. In order to recycle the cyclic alkylene carbonate, e.g., propylene carbonate, for reuse as a developing agent or stripping agent, it is necessary to recover a purified cyclic alkylene carbonate, e.g., propylene carbonate. By purified propylene carbonate is meant a propylene carbonate product that is substantially free of solids, as evidenced by a color value of less than 20 APHA (reference to platinum-cobalt standard), and that contains less than 0.1 weight percent water, and less than 0.1 weight percent propylene glycol.

Figure 1B:
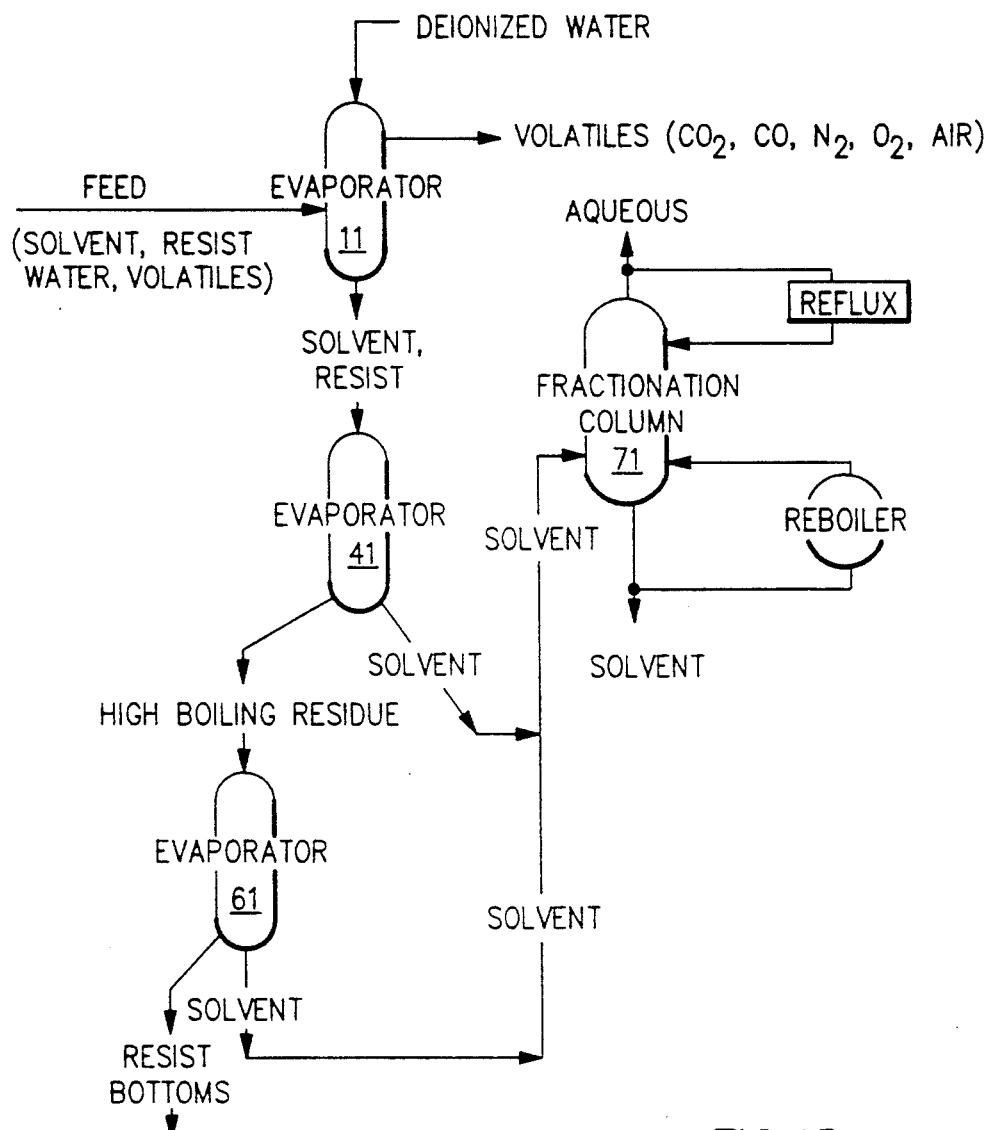

FIG. 1 is a flow chart for recovering propylene carbonate from an effluent stream of a process in which propylene carbonate removes an organic polymeric material, including monomeric additives and impurities, from a substrate. This effluent stream is an aqueous propylene carbonate effluent of propylene carbonate, water, and polymeric solids stream.

In the recovery process illustrated in FIG. 1 the effluent, e.g., propylene carbonate effluent, after being is fed to a dewatering unit, which is the first separation stage 11. This may be a short tube, vertical pipe heat exchanger type evaporator. In the first separation stage the effluent stream is separated into two streams, (i) a gaseous stream of water and volatiles withdrawn at the top of the first separation stage 11, and (ii) a liquid propylene carbonate stream.

This first stage separation lowers the concentration of water in the cyclic alkylene carbonate to a level that is low enough to substantially avoid hydrolysis of the carbonate to the corresponding glycol. In the case of propylene carbonate, the propylene carbonate concentration is reduced to a level that is low enough to substantially avoid hydrolysis of propylene carbonate to propylene glycol. In the first stage separator, as heat exchanger type evaporator 11, the total pressure in the heat exchanger is maintained higher than the vapor pressure of propylene carbonate at its open cup flash point. For a process stream containing 0.1 weight percent water in propylene carbonate, this corresponds to maintaining the process stream temperature below the open cup flash point of the propylene carbonate. That is, the process stream is maintained below about 132 degrees C., and the total pressure is maintained below about 25 torr.

The bottom product of the first separation stage is dewatered propylene carbonate, containing (i) from about 70 weight percent to about 99 weight percent of propylene carbonate, (ii) from about 0.2 weight percent to about 30 weight percent of "solids," that is, both dispersed solid polymer and dissolved, solubilized polymer (including monomer), (iii) from about 0.1 weight percent to about 12 weight percent of propylene glycol, and (iv) from about 0.01 weight percent to about 0.11 weight percent of water.

The dewatered propylene carbonate from the first stage separation 11 is further separated in a second stage separation 41 to separate the propylene carbonate from high boiling materials and polymeric solids, for example, by evaporation. In the second stage separation, which may be carried out in a wiped film evaporator, 41, the dewatered propylene carbonate is separated into (i) a propylene carbonate fraction, and (ii) a polymeric solids fraction. The polymeric solids fraction contains polymeric material in propylene carbonate.

The pressure in the evaporator 41 is maintained below about 35 torr, for example at about 5 to about 12 torr. The temperature in the evaporator 41 is maintained above about 100 degrees Centigrade.

The second stage separation 41 yields an overhead product of about 98 to about 99.9 weight percent propylene carbonate and a bottom product of polymeric material in propylene carbonate.

The overhead product of the second stage separation 41, that is the evaporated, dewatered propylene carbonate, is fed to a fractionation means 71. This fractionation means, which may be a packed tower 71, is used to further separate the evaporated, dewatered propylene carbonate into a higher vapor pressure propylene glycol fraction and a lower vapor pressure propylene carbonate fraction.

Optionally, propylene carbonate may also be recovered from the bottom product of the second stage, 41. The bottom product is polymeric material in the cyclic alkylene carbonate solvent, e.g., in propylene carbonate. The bottom product contains from about 70 to about 99.9 weight percent propylene carbonate, balance solids. According to this alternative method of the invention, the bottom product of the evaporator 41 is fed to a further evaporation step 61 and thereafter to fractionating means 71-71a. The overhead product of the second evaporator goes to fractionating unit 71-71a, as shown in FIG. 1A. The bottom product of the evaporator unit 61 is a polymer rich material that is discharged.

The product of the fractionation step, 71, is a fractionated product that is substantially free of polymeric materials. By being substantially free of polymeric materials is meant that the propylene carbonate product has a color value less than 20 APHA (reference to platinum-cobalt standard). The fractionated product is also substantially free of water, containing less than 0.01 weight percent water.

To recover a bottom product in the evaporator or pot of high purity cyclic alkylene carbonate, for example, high purity propylene carbonate, without degradation of the carbonate the column pressure must be carefully maintained. Preferably the top pressure of the fractionation means is less than 35 torr, and from about 6 to about 10 torr, and the bottom pressure is about 20 torr.

Critical to a high recovery of high purity cyclical alkylene carbonate, e.g., propylene carbonate, is the minimal in-process loss of cyclical alkylene carbonate. Propylene carbonate is not just lost with the solids. It is also lost chemically, for example, through the formation of by-products and hydrolysis products.

We have found that control of these in-process loss pathways requires low operating temperatures, minimal times at higher temperatures, and the substantial absence of water. The operating temperature and the exposure time to heat input surfaces are held to a minimum to both (1) slow the rate of decomposition of propylene carbonate, and (2) slow the rate of exothermic polymerization of any monomeric species present in the polymer. However, even at these relatively low temperatures, the thermally polymerizable monomer trimethylol-propane triacrylate (TMPTA) present in the photoresist carried in the effluent stream may exothermically polymerize. Thus it is necessary to incorporate a thermal polymerization inhibitor in the solvent.

Such thermal polymerization inhibitors which can be incorporated in this invention are compounds having the general formula (1) or (2).

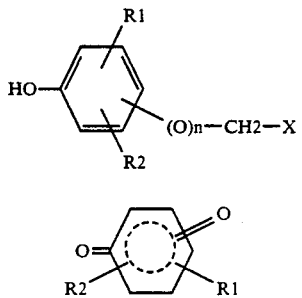

wherein n is 0 or 1;
where X is

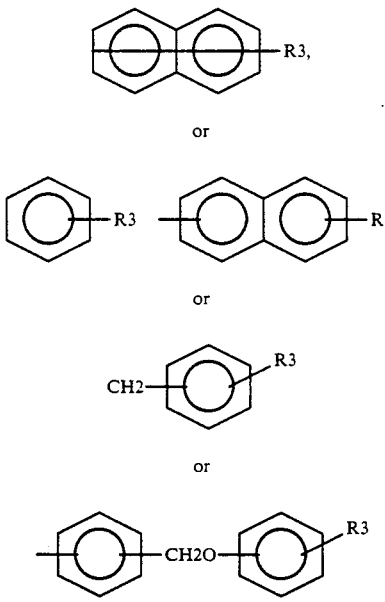

and $R_1$ and $R_2$ are independently H, —OH, $C_1$-$C_6$ alkyl; $R_3$ is H, —OH —COO—($C_1$-$C_6$ alkyl), $C_1$-$C_6$ alkyl, or $C_1$-$C_6$ alkoxy, provided that the compound has at least three rings. The above notation is intended to show that in two-ring substituents $R_3$ can be attached to either ring.

In formula (2), the ring contains two C═O groups and includes two C═C bonds.

Substituted phenols are preferred as the thermal polymerization inhibitor added to the solvent for this purpose. Preferred substituted phenols include such compounds as vanillin, butyl catechol, hydroquinone and butylated hydroxy toluene.

Other suitable thermal polymerization inhibitors that can be used in controlling or effectively reducing the reaction exotherm and also increase the stability during storage of the photosensitive compositions include: p-methoxyphenol, hydroquinone, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene, p-toluequinone and chloranil. Also useful as incorporated thermal polymerization inhibitors are copper organo-metallics and nitroso compositions.

The invention comprises a method for inhibiting polymerization of a monomer having a vinylic bond in a composition or stream of the monomer, polymer, and solvent, by adding to the monomer up to about 0.01 moles of an inhibitor of formula (1) or (2) above per mole of monomer. The inhibitor can be added by dissolving the inhibitor in the composition or stream of the solvent to be reclaimed from the process, e.g., the lithographic process. The thermal polymerization inhibitor can be added to the solvent either before the solvent is introduced for use as, e.g., a developing agent, a stripping agent, a degreasing agent, a cleaning agent, or the like, or after the use of the solvent and before its recovery. Thus, the thermal polymerization inhibitor can be present in a recycle stream of the solvent during its reuse.

The inhibitor used in this invention to suppress or interfere with the free radical polymerization suitably is soluble in the solvent composition and is effective in reasonably small amounts. The amount of thermal polymerization inhibitor present in the solvent should be an effective amount to inhibit polymerization of the monomer under normal separation, recovery, and reclamation conditions as well as storage conditions. Generally, concentrations of up to about 0.01 mole percent (basis moles of monomer) can be employed, although amounts of about 0.001 to about 0.005 mole percent are highly satisfactory.

Polymerization is considered to be "inhibited" if it is less likely to occur, or if it occurs to a lesser degree compared to the monomer with no inhibitor or with a less effective inhibitor, and preferably polymerization does not occur at all. More particularly, in separation and recovery processes involving thermal processing, e.g., distillation, fractionation, and evaporation, for separating solvents from water, other solvents, polymer, and monomer, thermal polymerization is considered to be inhibited if the heat evolved by thermally initiated exothermic polymerization does not significantly degrade the solvent being separated and recovered.

In order to attain relatively low temperatures and low exposure times of the solvent to heat transfer surfaces, it is necessary to carry out separation and recovery processing under substantial vacuum conditions. Substantial vacuum conditions reduce and even eliminate the need to heat the cyclic alkylene carbonate streams, for example, propylene carbonate streams, to high temperatures. An upper temperature that appears to avoid adverse by-products is the open cup flash point of the cyclic alkylene carbonate. In the case of propylene carbonate this is 132 degrees Centigrade. In the case of propylene carbonate, processing below the 132 degree C. open cup flash point thereof makes it possible to minimize combustion and explosion concerns. This avoids the need for damage limiting construction, as well as flame proof and explosion proof recovery equipment. Additionally, low temperatures reduce the rate of decomposition.

Moreover, if water is removed early in the process sequence it is possible to minimize decomposition of the cyclic alkylene carbonate, such as propylene carbonate, for example by hydrolysis. These considerations drive the process sequence shown in FIG. 1 and in the individual process steps shown below.

The multi-stage separation process described herein starts with a heavily contaminated feed, with visible suspended solids, strong color, and opaqueness. This feed is processed to yield water-white (clear) product, free of suspended solids and having a color value of less than 20 APHA (referenced to platinum-cobalt standard). The method of the invention is also particularly effective in water removal, reducing the water content from 7 weight percent in the feed to 0.01 weight percent in the recovered propylene carbonate product.

EXAMPLES

Example 1

A solution containing Riston T168 dissolved in methylene chloride and 328 parts per million of hydroquinone as the thermal polymerization inhibitor is thoroughly mixed at room temperature and then placed in a vacuum desiccator to remove the solvent and for a homogeneous film. Similar films containing 548 and 2000 parts per million of hydroquinone were also prepared. As the control Riston T168 (2 mil film) as received from DuPont was used.

The films after casting and drying were analyzed using Differential Scanning Calorimetry to measure the energy released, the onset temperature of the polymerization and the maximum temperature attained during the reaction. The results of this experiment are shown in Table 1.

TABLE 1

| Film | Hydroquinone (ppm) | $T_{onset}$ (C) | $T_{max}$ (C) |
|---|---|---|---|
| 1 | 0 | 122 | 135 |
| 2 | 328 | 142 | 160 |
| 3 | 548 | 145 | 165 |
| 4 | 2800 | 170 | 180 |

Example 2

Samples of inhibited and uninhibited Riston T168 were exposed to 110° C. for various time intervals and the residual heat of reaction was measured utilizing Differential Scanning Calorimetry. Results in Table show the delay in release of heat during the thermal polymerization.

TABLE 2

Thermal polymerization of Riston T168 at 110° C.

| Time (minutes) | Residual Heat of Reaction (Joules/gram) | |
|---|---|---|
| | inh. film | uninh. film |
| 0 | — | 220 |
| 2 | — | 70 |
| 5 | 185 | 38 |
| 10 | 170 | — |
| 30 | 140 | 15 |

While the invention has been described with respect to certain preferred embodiments and exemplifications, it is not intended to limit the scope of the invention thereby, but solely by the claims appended hereto.

We claim:

1. A photolithographic method comprising removing an acrylic acid-acrylate ester photolithographic polymer film from a substrate, and circuitizing said substrate, said polymeric film containing monomeric trimethylol-propane triacrylate capable of thermally initiated exothermic polymerization, said method comprising:
   a. contacting the photolithographic polymeric film with (i) water, and (ii) cyclic alkylene carbonate organic solvent;
   b. recovering an effluent stream comprising water, the cyclic alkylene carbonate organic solvent, the acrylic acid-acrylate polymeric material, and monomeric triethylol-propane triacrylate;
   c. adding a quinone thermal polymerization inhibitor to the cyclic alkylene carbonate solvent to stabilize the monomeric triethylol-propane triacrylate against exothermic polymerization;
   d. thereafter
      (i) thermally separating the water from the cyclic alkylene carbonate solvent, and
      (ii) thermally separating the cyclic alkylene carbonate solvent from the effluent stream, while avoiding exothermic polymerization of acrylic acid-acrylate monomer and of the monomeric triethylol-propane triacrylate and polymerization exotherm induced hydrolysis of the cyclic alkylene carbonate solvent to the corresponding alkylene glycol;
   e. separating cyclic alkylene carbonate solvent from high boiling materials and polymeric solids; and
   f. receiving the cyclic alkylene carbonate solvent.

2. The method of claim 1 wherein the cyclic alkyl carbonate has the structural formula

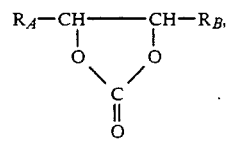

where $R_A$ and $R_B$ are independently chosen from the group consisting of H— and $CH_3—(CH_2)_n—$, where n is an integer from 0 to 3, and at least one of $R_A$ and $R_B$ is $CH_3—(CH_2)_n—$.

3. The method of claim 2 wherein the cyclic alkylene carbonate is propylene carbonate.

4. The method of claim 1 wherein the quinone thermal polymerization inhibitor is chosen from the group consisting of hydroquinone, p-methoxy phenol, alkyl substituted hydroquinones, aryl substituted quinones, tert-butyl catechol, pyrogallol, naphthylamines, beta-naphthol, 2,6-di-tert-butyl-p-cresol, phenothiazine, pyridine, nitrobenzene, dinitrobenzene, p-toluequinone, and chloranil.

5. The method of claim 1 wherein the concentration of quinone thermal polymerization inhibitor is at least about 0.001 mole percent (basis moles of monomer).

* * * * *